(12) United States Patent
Lai (10) Patent No.: US 8,344,602 B2
(45) Date of Patent: Jan. 1, 2013

(54) LIGHT EMITTING DIODE AND LIGHT SOURCE MODULE INCORPORATING THE SAME

(75) Inventor: Chih-Ming Lai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 93 days.

(21) Appl. No.: 12/822,199

(22) Filed: Jun. 24, 2010

(65) Prior Publication Data

US 2011/0248616 A1 Oct. 13, 2011

(30) Foreign Application Priority Data

Apr. 12, 2010 (TW) .............................. 99111209 A (51) Int. Cl.
*H01J 61/52* (2006.01)
(52) U.S. Cl. .......................................... 313/46; 313/506
(58) Field of Classification Search ............... 313/46, 313/498–512
See application file for complete search history.

(56) References Cited

U.S. PATENT DOCUMENTS

| 2007/0252161 A1* | 11/2007 | Meis et al. ........................ 257/88 |
| 2008/0296599 A1* | 12/2008 | Mazzochette ................... 257/98 |
| 2009/0109617 A1* | 4/2009 | Grajcar .......................... 361/688 |
| 2010/0230709 A1* | 9/2010 | Kanno ............................ 257/99 |

* cited by examiner

*Primary Examiner* — Anh Mai
(74) *Attorney, Agent, or Firm* — Altis Law Group, Inc.

(57) ABSTRACT

A light emitting diode (LED) includes an LED chip, a casting, two metallic electrodes and a heat sink. The casting includes a first surface, a second surface and an outer peripheral side surface interconnecting the first and second surfaces. The casting defines a receiving space concaved inwardly from the first surface for receiving the LED chip therein. A through hole is defined in the casting and extends from the receiving space to the second surface. The metallic electrodes are separated from each other. Each metallic electrode includes a first terminal electrically connecting with the LED chip, and a second terminal disposed at the outer peripheral side surface of the casting. The heat sink is filled in the through hole and thermally contacts the LED chip. The heat sink is thermally and electrically insulated from the metallic electrodes by the casting.

10 Claims, 10 Drawing Sheets

FIG. 10

LIGHT EMITTING DIODE AND LIGHT SOURCE MODULE INCORPORATING THE SAME

CROSS-REFERENCE TO RELATED APPLICATIONS

Relevant subject matters are disclosed in co-pending U.S. patent application Ser. No. 12/766,917 and Ser. No. 12/766,918, both of which are filed on Apr. 25, 2010 and assigned to the same assignee as the present application. The two co-pending applications are incorporated herein by reference.

BACKGROUND

1. Technical Field

The disclosure generally relates to light emitting diodes (LEDs), and particularly to an LED which has high heat dissipation efficiency. The disclosure also relates to a light source module incorporating such LED.

2. Description of Related Art

It is well known that LEDs have been widely used in illumination devices to substitute for conventional cold cathode fluorescent lamps (CCFLs), incandescent bulbs, compact bulbs or fluorescent tubes, due to high brightness, long lifespan, and wide color range of the LEDs. However, during operation of the LEDs, a large of heat is generated. If the heat is not efficiently removed, the LEDs may suffer damage.

A typical LED has a pair of metallic electrodes extending perpendicularly down therefrom. The electrodes are inserted into a pair of slots of a circuit board, respectively, for thermally and electrically connecting the LED with the circuit board. The electrodes play double roles, i.e., heat transfer and electrical conduction. The electric current supplied to the LED via the electrodes affect the heat dissipation capability of the electrodes. Thus, a heat resistance of the LED is increased, which affects a heat dissipation efficiency of the LED.

What is needed, therefore, is an LED and a light source module incorporating the LED which can overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
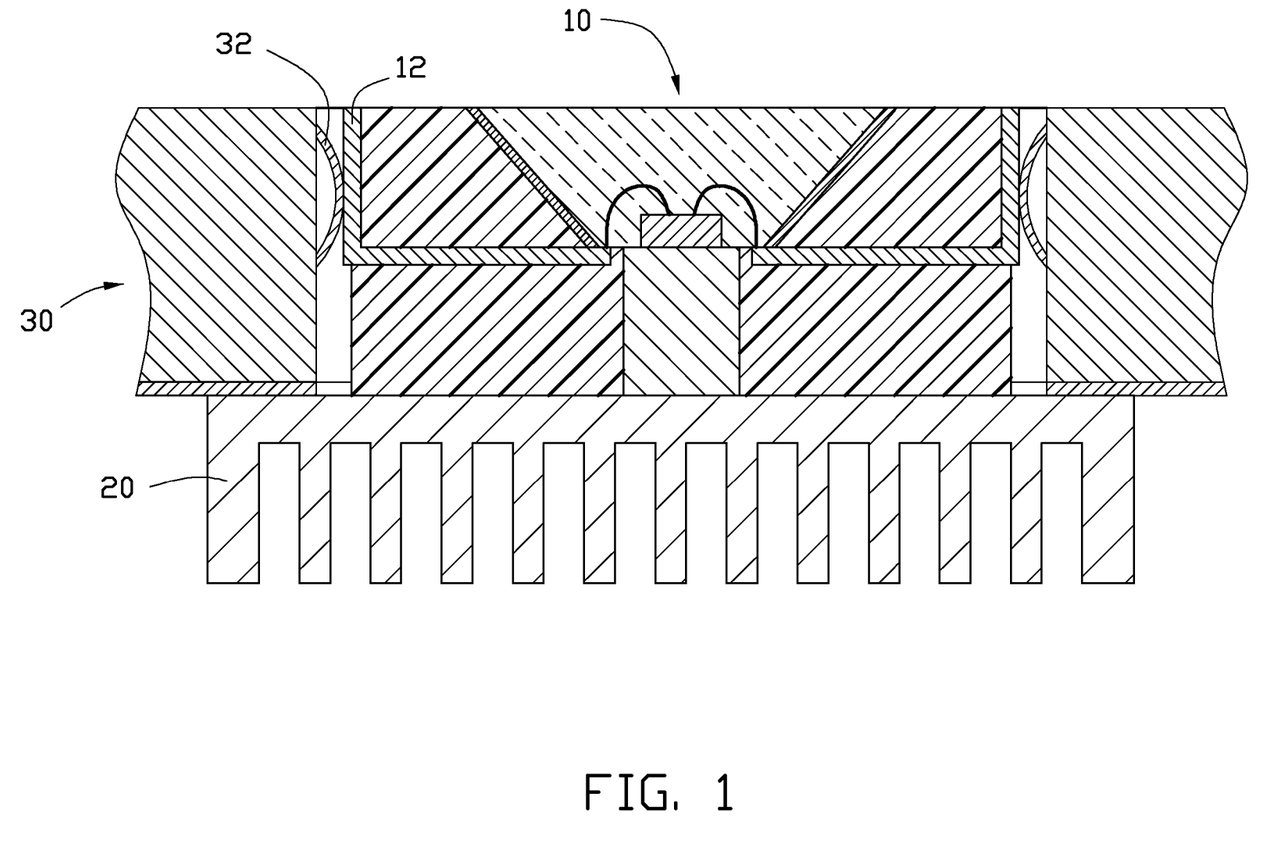
FIG. 1 is an assembled, cross sectional view of a light source module in accordance with a first embodiment of the disclosure.
Figure 2:
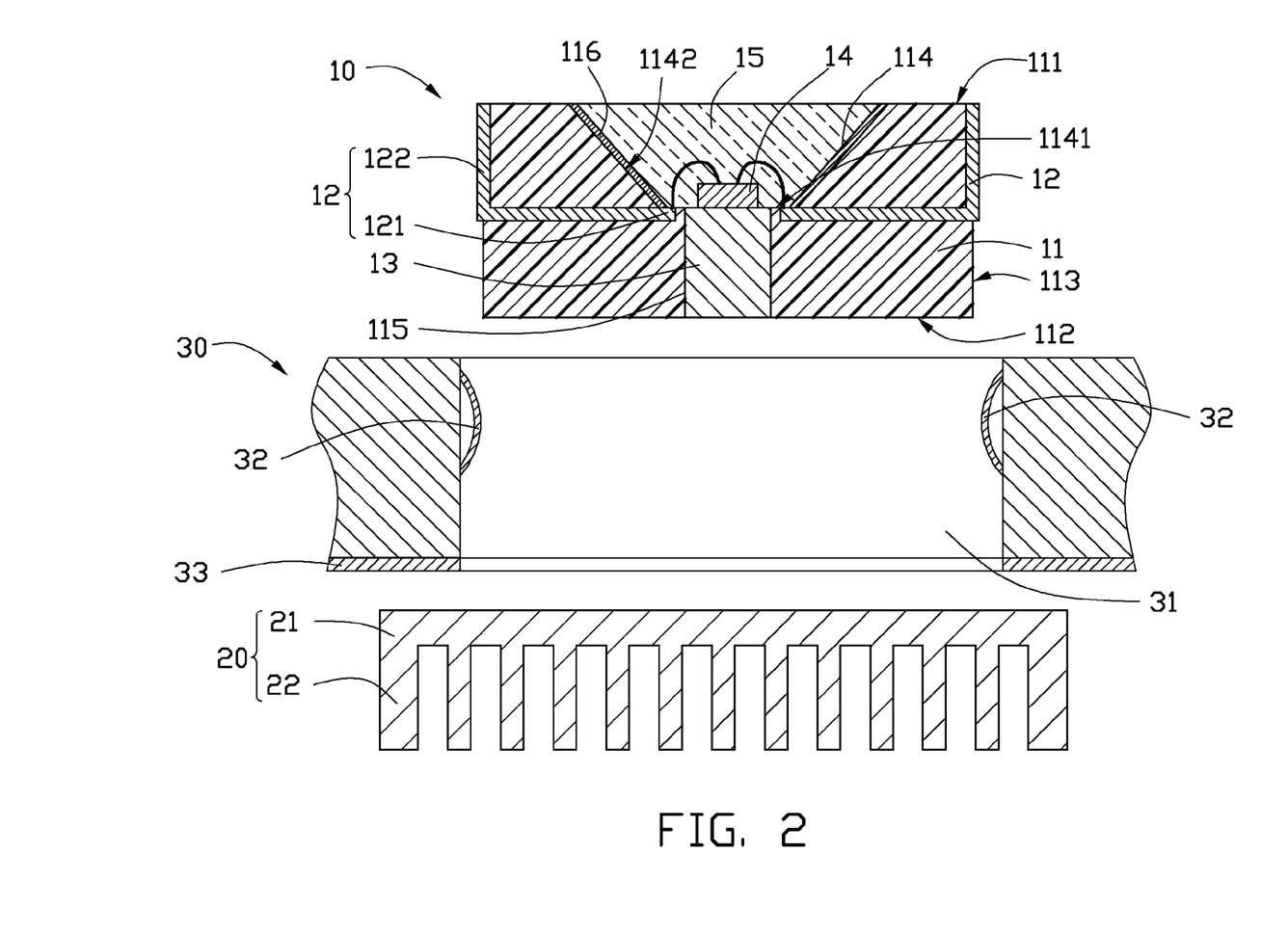
FIG. 2 is an exploded view of the light source module of FIG. 1.

Referring to FIGS. 1 and 2, a light source module in accordance with a first embodiment of the disclosure is shown. The light source module includes an LED 10, a heat dissipation device 20 thermally connecting the LED 10, and a circuit board 30 electrically connecting the LED 10.

The LED 10 includes a casting 11, two metallic electrodes 12, a heat sink 13, an LED chip 14, and an encapsulation layer 15.

The casting 11 is generally cylindrical. Alternatively, the casting 11 can be generally cuboid or disk-shaped. The casting 11 includes a first surface 111, a second surface 112, and an outer peripheral side surface 113. The first surface 111 and the second surface 112 are located at opposite sides of the casting 11, respectively. The outer peripheral side surface 113 is located between and interconnects the first surface 111 and the second surface 112. A base material of the casting 11 has a high heat resistance and good electrical insulation performance. One example of the base material can be liquid crystal polymer (LCP) or thermoplastic resin, such as polybutylene terephthalate (PBT). Furthermore, titanium dioxide or aluminum oxide in the form of particles can be mixed in the base material of the casting 11; thus, the casting 11 may have the ability to sustain high temperature.

The casting 11 defines a receiving space 114 concaved inwardly from the first surface 111 for receiving the LED chip 14. The casting 11 further includes a supporting surface 1141 at a bottom of the receiving space 114 and a lateral surface 1142 surrounding the receiving space 114. The receiving space 114 has a truncated cone shape, and tapers from the first surface 111 to the supporting surface 1141 of the casting 11. The casting 11 defines a through hole 115 extending downwardly from the supporting surface 1141 to the second surface 112 thereof. The through holes 115 is in communication with the receiving space 114. The through hole 115 is generally cylindrical, and coaxial with the receiving space 114. A diameter of the through hole 115 is smaller than the minimum diameter of the receiving space 114. The supporting surface 1141 is formed at a junction of the through hole 115 and the receiving space 114. A reflective layer 116 is coated on the lateral surface 1142 of the casting 11 surrounding the receiving space 114. The reflective layer 116 is for reflecting light from the LED chip 14 to an outside of the receiving space 114.

The metallic electrodes 12 electrically connect the LED chip 14. The metallic electrodes 12 are separated from each other, and serve as a positive electrode and a negative electrode of the LED chip 14, respectively. The metallic electrodes 12 are adopted for electrically connecting the LED chip 14 with the circuit board 30, whereby electric current can be supplied to the LED chip 14.

The metallic electrodes 12 are partially covered by the casting 11, and are thermally and electrically insulated from the heat sink 13 by the casting 11. Each of the metallic electrodes 12 is bent to have an L-shaped cross section. In particular, each metallic electrode 12 extends horizontally from the supporting surface 1141 to the outer peripheral side surface 113 all the way through an inside of the casting 11, and further extends upwardly along the outer peripheral side surface 113. Each metallic electrode 12 includes a first terminal 121 and a second terminal 122 at opposite ends thereof, respectively. The first terminal 121 is disposed at the supporting surface 1141. The second terminal 122 contacts the outer peripheral side surface 113 of the casting 11 and is exposed to an outside of the LED 10. In this embodiment, the second terminal 122 covers an upper portion of the outer peripheral side surface 113 of the casting 11 corresponding to the receiving space 114. Alternatively, the metallic electrodes 12 can extend to the outer peripheral side surface 113 of the casting 11 via another path; for example, the metallic electrodes 12 can extend from the supporting surface 1141 to the first surface 111 of the casting 11 through the lateral surface 1142 in the receiving space 114, and then extend to the outer peripheral side surface 113 of the casting 11.

The heat sink 13 is made of metal or metal alloy with a high heat conductivity coefficient, such as copper, copper-alloy, or other suitable material. The heat sink 13 is column-shaped, and is received in the through hole 115. In this embodiment, a height of the heat sink 13 is equal to a depth of the through hole 115. The heat sink 13 is fully filled in the through hole 115. The heat sink 13 has a top surface coplanar with the supporting surface 1141, and a bottom surface coplanar with the second surface 112 of the casting 11.

The LED chip 14 is essentially made of phosphide such as $Al_xIn_yGa_{(1-x-y)}P$ ($0 \leq x \leq 1$, $0 \leq y \leq 1$, $x+y \leq 1$) or arsenide, such as AlInGaAs, or another suitable material, for example nitrides, such as $In_xAl_yGa_{(1-x-y)}N$ ($0 \leq x \leq 1$, $0 \leq y \leq 1$, $x+y \leq 1$). The LED chip 14 includes a substrate (not shown) made of intrinsic semiconductor or unintentionally doped semiconductor, such as spinel, SiC, Si, ZnO, GaN, GaAs, GaP, or AlN. Alternatively, the substrate of the LED chip 14 may be made of material with high thermal conductivity and good electrical insulation property, such as diamond. A carrier concentration of the substrate is less than or equal to $5 \times 10^6$ cm$^{-3}$, or preferably less than or equal to $2 \times 10^6$ cm$^{-3}$. The substrate of the LED chip 14 with less carrier concentration may have lower conductivity; thus, electric current following through the casting 11 may be avoided. Accordingly, electric current applied to the LED chip 14 can be efficiently used, and the LED chip 14 emits light efficiently.

The LED chip 14 is disposed in the receiving space 114, and is snugly attached to the top surface of the heat sink 13. In one embodiment, when the LED chip 14 is attached to the heat sink 13, a eutectic process can be applied to adhere the LED chip 14 with the heat sink 13 within an ultrasonic field and high temperature environment. Such adhesion can be achieved by melting, bonding, or fusing. Alternatively, the LED chip 14 may be attached to the heat sink 13 via an adhesive layer (not shown). The adhesive layer can be coated on either or both of the LED chip 14 and the top surface of the heat sink 13, before the LED chip 14 is attached to the heat sink 13. The adhesive layer may be made of metallic material selected from the group consisting of gold, tin, and silver. Alternatively, the adhesive layer may be colloidal silver, or solder paste, or another suitable adhesive material.

The LED chip 14 forms a positive contact pad (not shown) and a negative contact pad (not shown) thereon. The positive and negative contact pads of the LED chip 14 are electrically connected with the first terminals 121 of the metallic electrodes 12 by wire bonding, respectively.

The encapsulation layer 15 is received in the receiving space 114 to cover the LED chip 14 and the reflective layer 116. In particular, the encapsulation layer 15 is fully filled in the receiving space 114, and adheres to the supporting surface 1141 and the lateral surface 1142. A top of the encapsulation layer 15 is coplanar with the first surface 111 of the casting 11.

A base material of the encapsulation layer 15 can be of light-pervious material selected from the group consisting of resin, silicone, glass, epoxy, polyethylene terephthalate, polymethyl methacrylate, and polycarbonate. Alternatively, the encapsulation layer 15 may further include at least one optical wavelength converting material, mixed essentially uniformly in the base material. The at least one optical wavelength converting material can be in the form of particles, and may include one kind of phosphor or different kinds of phosphors. The phosphor or phosphors for example, can be red phosphor, yellow phosphor, green phosphor, or phosphors having other colors. The phosphor or phosphors may be comprised of one of sulfides, aluminates, oxides, silicates and nitrides. For example, the phosphor or phosphors may be $Ca_2Al_{12}O_{19}$:Mn, (Ca, Sr, Ba)$Al_2O_4$:Eu, CdS, CdTe, $Y_3Al_5O_{12}Ce^{3+}$(YAG), $Tb_3Al_5O_{12}$:$Ce^{3+}$(YAG), $BaMgAl_{10}O_{17}$:$Eu^{2+}$($Mn^{2+}$), $Ca_2Si_5N_8$:$Eu^{2+}$, (Ca, Sr, Ba)S:$Eu^{2+}$, (Mg, Ca, Sr, Ba)$_2SiO_4$:$Eu^{2+}$, (Mg, Ca, Sr, Ba)$_3Si_2O_7$:$Eu^{2+}$, $Y_2O_2S$:$Eu^{3+}$, $Ca_8Mg(SiO_4)_4Cl_2$:$Eu^{2+}$, (Sr, Ca, Ba)$Si_xO_yN_z$:$Eu^{2+}$, (Ca, Mg, Y)Si-$wAl_xO_yN_z$:$Eu^{2+}$, or CdSe.

The heat dissipation device 20 is made of metal or metal alloy with a high heat conductivity coefficient, such as copper, copper-alloy, or other suitable material. The heat dissipation device 20 is for dissipating heat generated by the LED 10. The heat dissipation device 20 includes a base 21, and a plurality of fins 22 extending out from the base 21. The base 21 is snugly attached to the bottom surface of the heat sink 13 of the LED 10 and the second surface 112 of the casting 11. In particular, the LED 10 can be adhered to the base 21. During operation, heat generated by the LED 10 is transferred to the fins 22 via the base 21.

A base material of the circuit board 30 can be polyester (PET), polyimide (PI), polyethylene naphthalate (PEN), epoxy, or fiberglass, or another suitable material. The circuit board 30 defines an accommodating hole 31 therein. The accommodating hole 31 has a diameter greater than that of the casting 11 of the LED 10. The circuit board 30 forms two opposite elastic electrodes 32 at an inner surface thereof surrounding the accommodating hole 31. The elastic electrodes 32 may be laminar or strip-shaped. In this embodiment, each of the elastic electrodes 32 is arcuate, with two opposite ends thereof soldered on the circuit board 30, and a middle portion thereof extending into the accommodating hole 31 of the circuit board 30. A distance between the middle portions of the elastic electrodes 32 is less than a distance between the second terminals 122 of the metallic electrodes 12. The circuit board 30 further forms an insulating layer 33 at a bottom surface thereof. A base material of the insulating layer 33 has high heat resistance and good electrical insulation performance. One example of the base material can be liquid crystal polymer (LCP) or thermoplastic resin, such as polybutylene terephthalate (PBT). Furthermore, titanium dioxide or aluminum oxide in the form of particles can be mixed in the base material of the insulating layer 33; thus, the insulating layer 33 may have the ability to sustain high temperature.

During assembly, the LED 10 is pressed and inserted into the accommodating hole 31 of the circuit board 30, with the second terminals 122 of the metallic electrodes 12 abutting against the elastic electrodes 32 of the circuit board 30, respectively. The LED 10 is mounted in the circuit board 30 due to an elastic deformation of the elastic electrodes 32. The heat dissipation device 20 is coupled to the LED 10, with the base 21 of the heat dissipation device 20 attached to the second surface 112 of the casting 11, the bottom surface of the heat sink 13 and the insulating layer 33 of the circuit board 30.

During operation, the circuit board 30 supplies electric current to the LED chip 14 via the elastic electrodes 32 and the metallic electrodes 12 to cause the LED chip 14 to emit light. The light emitted from the LED chip 14 passes through the encapsulation layer 15 to the outside of the LED 10. On the other hand, heat is generated by the LED chip 14 and is transferred to the heat dissipation device 20 via the heat sink 13 for dissipation. By this way, the LED chip 13 operates continually within an acceptable temperature range to achieve stable optical performance, and the brightness and the luminous efficiency of the LED 10 are stably maintained.

In the LED 10 and the light source module incorporating the LED 10, the metallic electrodes 12 are thermally and electrically insulated from the heat sink 13 by the casting 11, and the circuit board 30 is thermally and electrically insulated from the heat sink 13 and the heat dissipation device 20 by the insulating layer 33. Therefore, the heat generated by the LED chip 14 and the electric current supplied to the LED chip 14 cannot affect each other. Thus, the LED 10 and the light source module incorporating the LED 10 emit light efficiently as well as dissipate heat efficiently. In addition, the second terminals 122 of the metallic electrodes 12 of the LED 10 are disposed at the outer peripheral side surface 113 of the casting 11, and the circuit board 30 forms the elastic electrodes 32 at the inner surface thereof surrounding the accommodating hole 31. Therefore, the LED 10 is assembled to the circuit board 30 merely via inserting operations of the LED 10. This simplifies the assembly of the light source module. Furthermore, the LED 10 can be easily disassembled from the circuit board 30 by pulling the LED 10 away from the accommodating hole 31. Therefore, components such as the LED 10, or the circuit board 30 can be easily changed or repaired, whereby the cost of maintaining the light source module is decreased.

Figure 3:
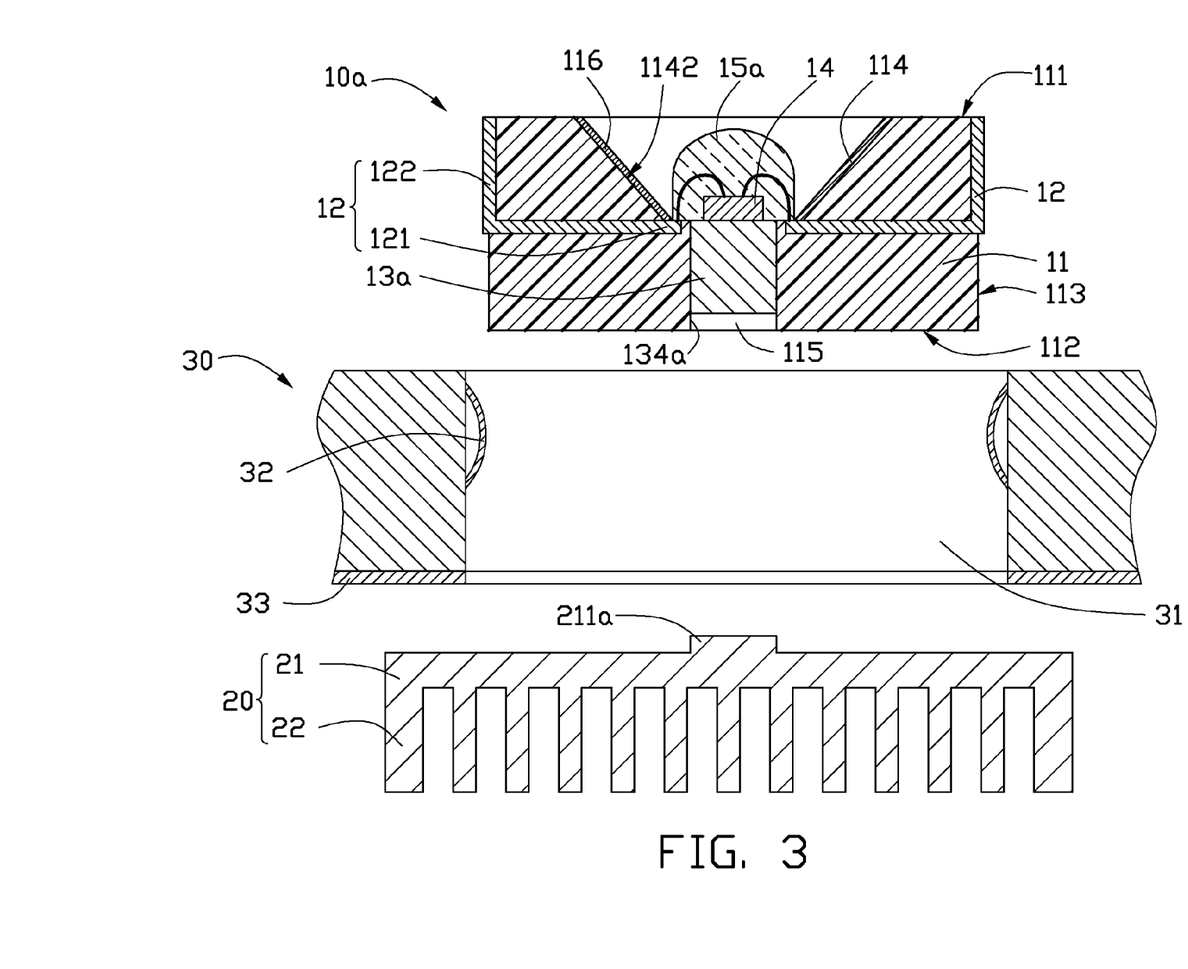
FIG. 3 is similar to FIG. 2, but shows a light source module of a second embodiment of the disclosure.

Referring to FIG. 3, a light source module, in accordance with a second embodiment of the disclosure, is shown. In this embodiment, an LED 10a of the light source module includes an encapsulation layer 15a covering the LED chip 14 but not necessarily covering the lateral surface 1142 of the casting 11. In this embodiment, the encapsulation layer 15a is spherical and dome-shaped. In addition, a height of a heat sink 13a is less than a depth of the through hole 115. The heat sink 13a is partially received in the though hole 115, and a bottom surface of the heat sink 13a is higher than the second surface 112 of the casting 11, whereby the bottom surface of the heat sink 13a and the second surface 112 cooperatively form a step surface 134a therebetween. Furthermore, a base 21a of a heat dissipation device 20a includes a protrusion 211a extending toward the LED 10a. The protrusion 211a is fittingly engaged in the through hole 115 of the casting 11 at the step surface 134a, thereby snugly contacting the heat sink 13a received in the through hole 115. Thus, heat generated by the LED 10a can be dissipated more efficiently via the heat dissipation device 20a.

Figure 4:
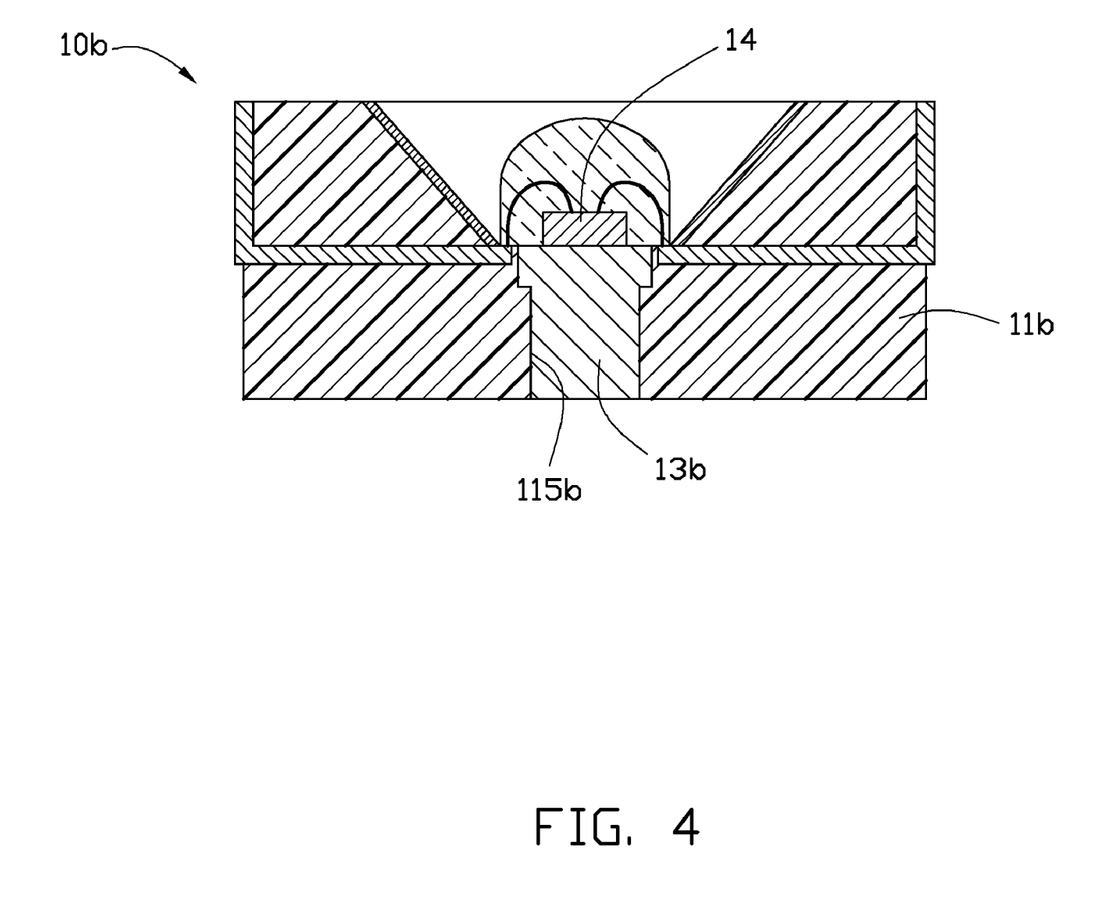
FIG. 4 is similar to FIG. 1, but shows an LED of a light source module of a third embodiment of the disclosure.

Referring to FIG. 4, an LED 10b of a light source module, according to a third embodiment of the disclosure, is shown. The LED 10b differs from the LED 10a of the second embodiment of FIG. 3 in that a top end of a through hole 115b of a casting 11b adjacent to the LED chip 14 has a larger size than a bottom end of the through hole 115b away from the LED chip 14. In particular, the through hole 115b has a T-shaped cross section. A heat sink 13b is fully filled in the though hole 115b. Accordingly, a top end of the heat sink 13b adjacent to the LED chip 14 has a larger size than a bottom end of the heat sink 13b away from the LED chip 14. The heat sink 13b can be securely received in the hole 115b.

Figure 5:
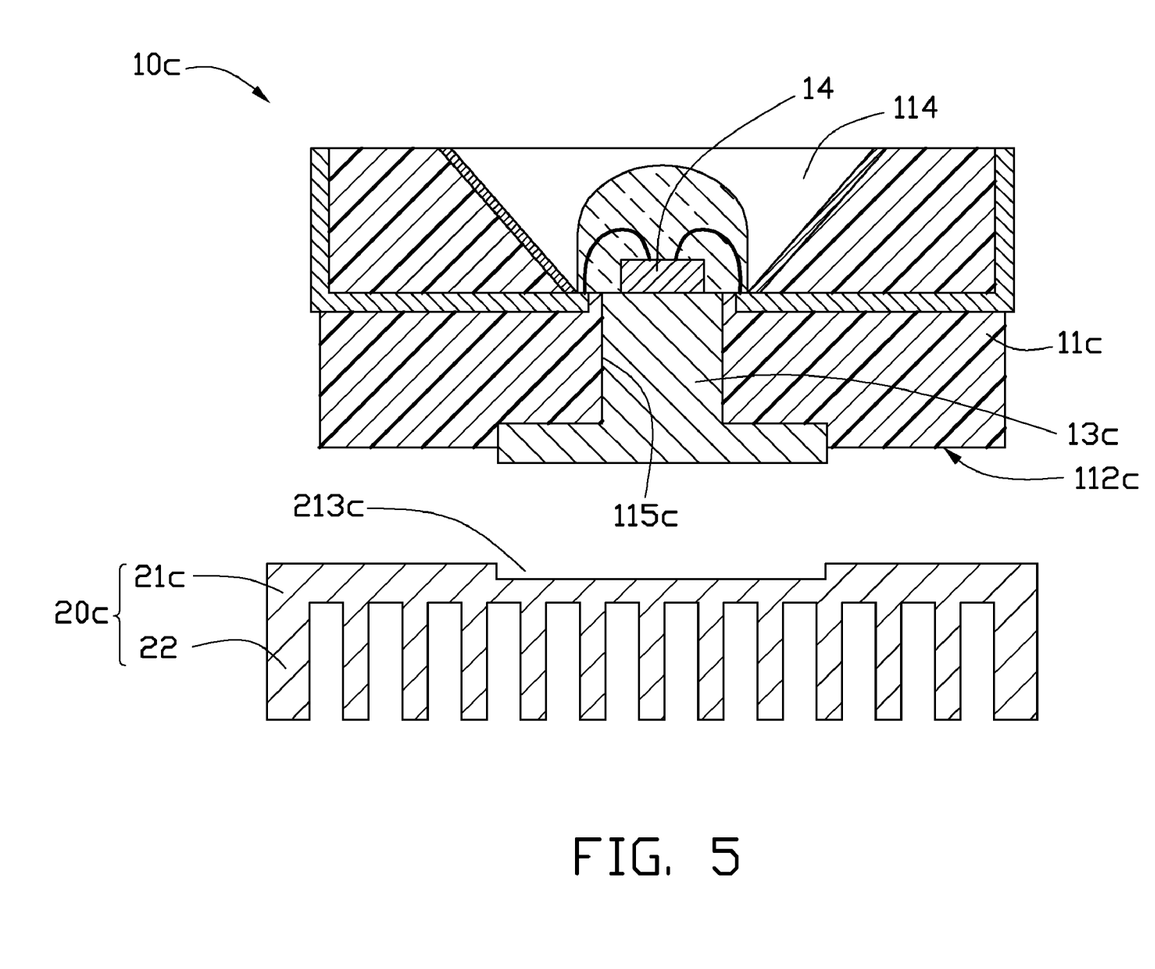
FIG. 5 is similar to FIG. 1, but shows an LED and a heat dissipation device of a light source module of a fourth embodiment of the disclosure.

Referring to FIG. 5, an LED 10c and a heat dissipation device 20c of a light source module, according to a fourth embodiment of the disclosure, is shown. The LED 10c differs from the LED 10a of the second embodiment of FIG. 3 in that a bottom end of a through hole 115c of a casting 11c away from the LED chip 14 has a larger size than a top end of the through hole 115c adjacent to the LED chip 14. In particular, the through hole 115c has an inverted T-shaped cross section. A heat sink 13c is fully filled in the though hole 115c. Accordingly, a bottom end of the heat sink 13b away from the LED chip 14 has a larger size than a top end of the heat sink 13b adjacent to the LED chip 14. In addition, the bottom end of the heat sink 13c away from the LED chip 14 further protrudes out from the second surface 112c of the casting 11c. The heat dissipation device 20c differs from the heat dissipation device 20a of the second embodiment of FIG. 3 in that a base 21c of the heat dissipation device 20c defines a recess 213c in a top surface thereof. A portion of the heat sink 13c protruding out from the second surface 112c of the casting 11c is stably engaged in the recess 213c, thereby snugly contacting the base 21c of the heat dissipation device 20c.

Figure 6:
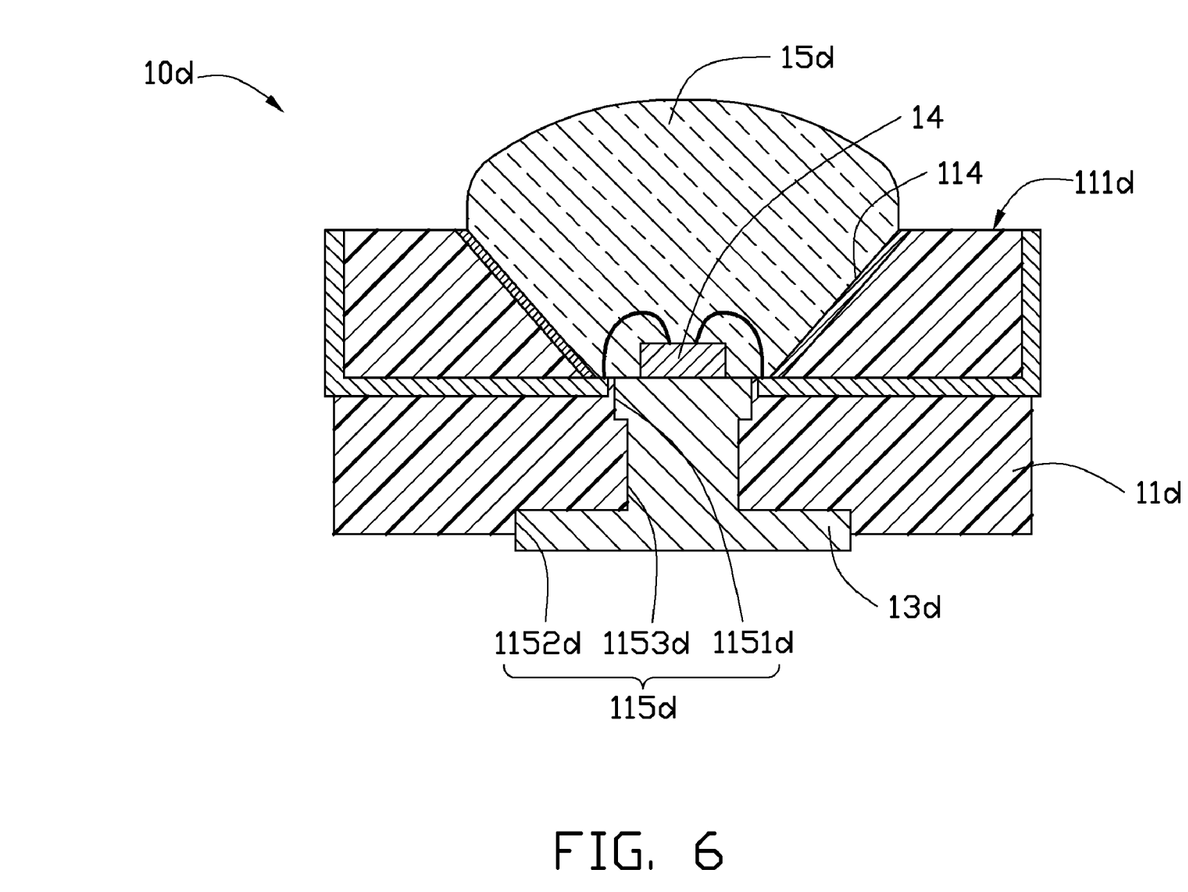
FIG. 6 is similar to FIG. 1, but shows an LED of a light source module of a fifth embodiment of the disclosure.

Referring to FIG. 6, an LED 10d of a light source module, according to a fifth embodiment of the disclosure, is shown. The LED 10d differs from the LED 10c of the fourth embodiment of FIG. 5 in that a through hole 115d of a casting 11d includes a first portion 1151d adjacent to the LED chip 14, a second portion 1152d away from the LED chip 14, and a third portion 1153d between the first and second portions 1151d, 1152d. The third portion 1153d communicates the first portion 1151d with the second portion 1152d. The third portion 1153d has a size smaller than either of the first and the second portions 1151d, 1152d. The second portion 1152d has a size larger than the first portion 1151d. A heat sink 13d is fully filled in the though hole 115d. The heat sink 13c has a shape corresponding to the though hole 115d. In addition, an encapsulation layer 15d is fully filled in the receiving space 114, and further protrudes out from a first surface 111d of the casting 11d to form a dome-like shape.

Figure 7:
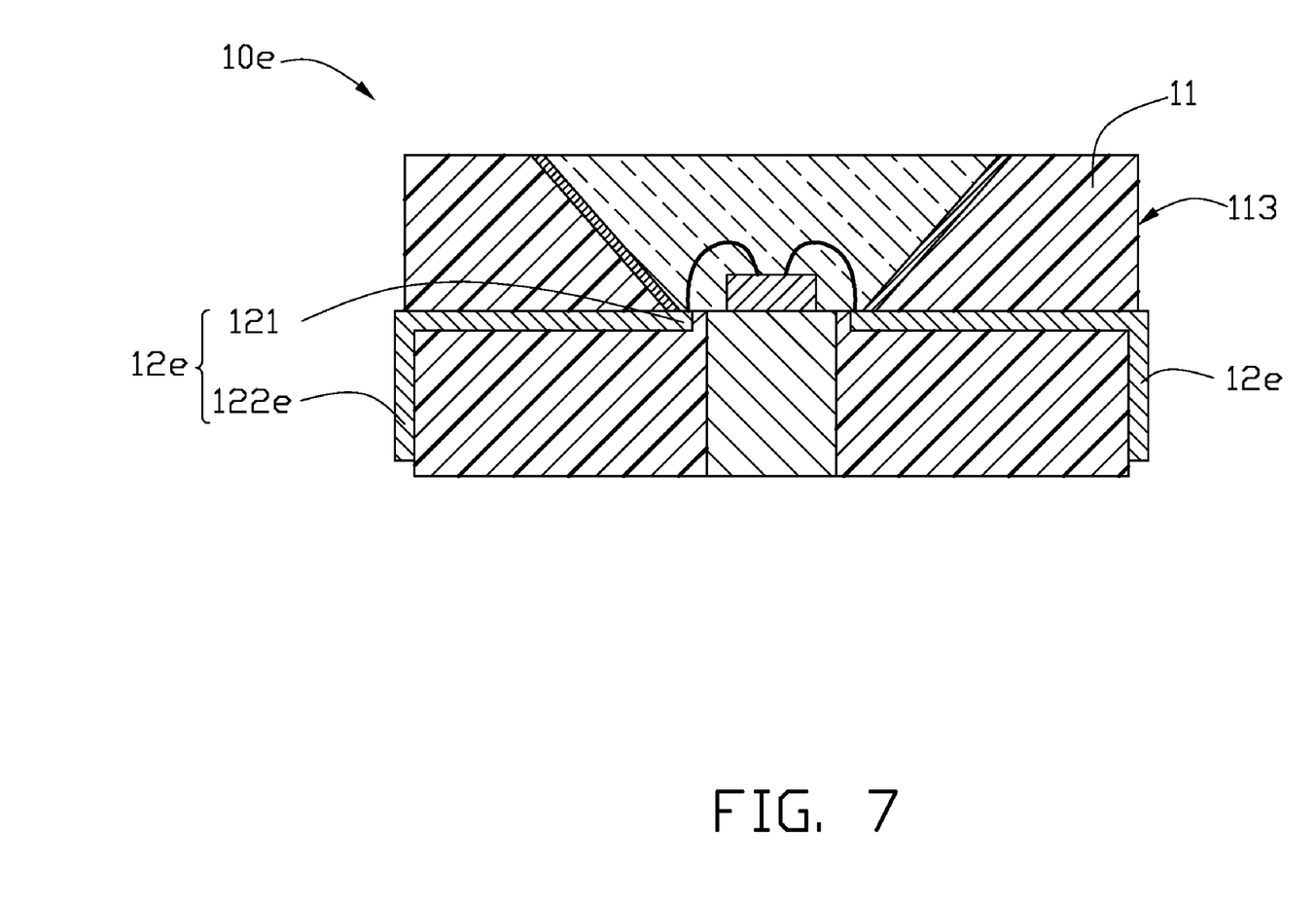
FIG. 7 is similar to FIG. 1, but shows an LED of a light source module of a sixth embodiment of the disclosure.

Referring to FIG. 7, an LED 10e of a light source module, according to a sixth embodiment of the disclosure, is shown. The LED 10e differs from the LED 10 of the first embodiment of FIGS. 1 and 2 in that a second terminal 122e of each metallic electrode 12e extends downwardly along the outer peripheral side surface 113 of the casting 11. The second terminal 122e contacts a lower portion of the outer peripheral side surface 113 of the casting 11.

Figure 8:
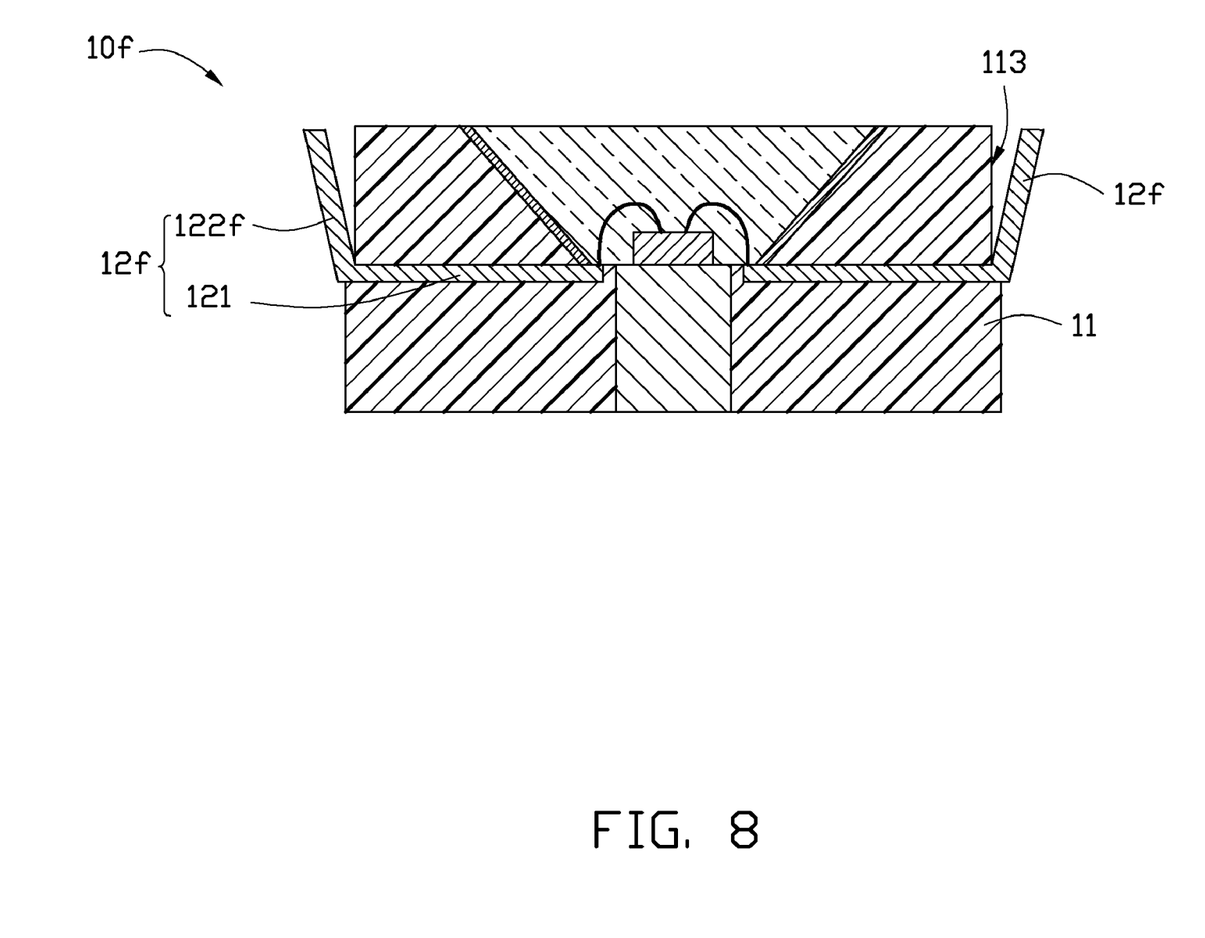
FIG. 8 is similar to FIG. 1, but shows an LED of a light source module of a seventh embodiment of the disclosure.

Referring to FIG. 8, an LED 10f of a light source module, according to a seventh embodiment of the disclosure, is shown. The LED 10f differs from the LED 10 of the first embodiment in that a second terminal 122f of each metallic electrode 12f is spaced from the outer peripheral side surface 113 of the casting 11, and extends obliquely, outwardly and upwardly from a corresponding first terminal 121. Therefore, the second terminal 122f of each metallic electrode 12f has a relatively greater elastic capability, whereby the LED 10f can be mounted in the circuit board 30 more stably. Alternatively, the second terminal 122e of each metallic electrode 12e of the sixth embodiment can extend obliquely, outwardly and downwardly from the corresponding first terminal 121.

Figure 9:
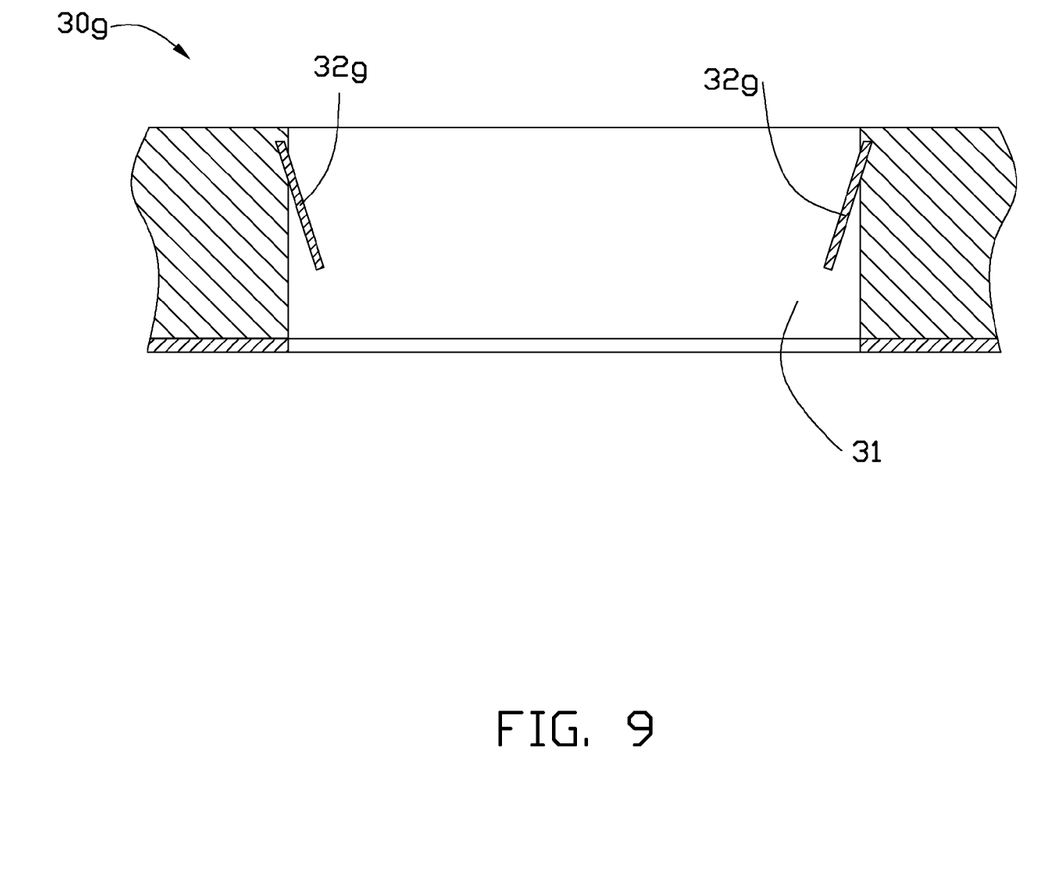
FIG. 9 is similar to FIG. 1, but shows a circuit board of a light source module of an eighth embodiment of the disclosure.

Referring to FIG. 9, a circuit board 30g of a light source module, according to an eighth embodiment of the disclosure, is shown. The circuit board 30g differs from the circuit board 30 of the first embodiment in that each elastic electrode 32g is straight. Each elastic electrode 32g has one end fixed on the inner surface of the circuit board 30g surrounding the accommodating hole 31, and another opposite end obliquely extending into the accommodating hole 31.

Figure 10:
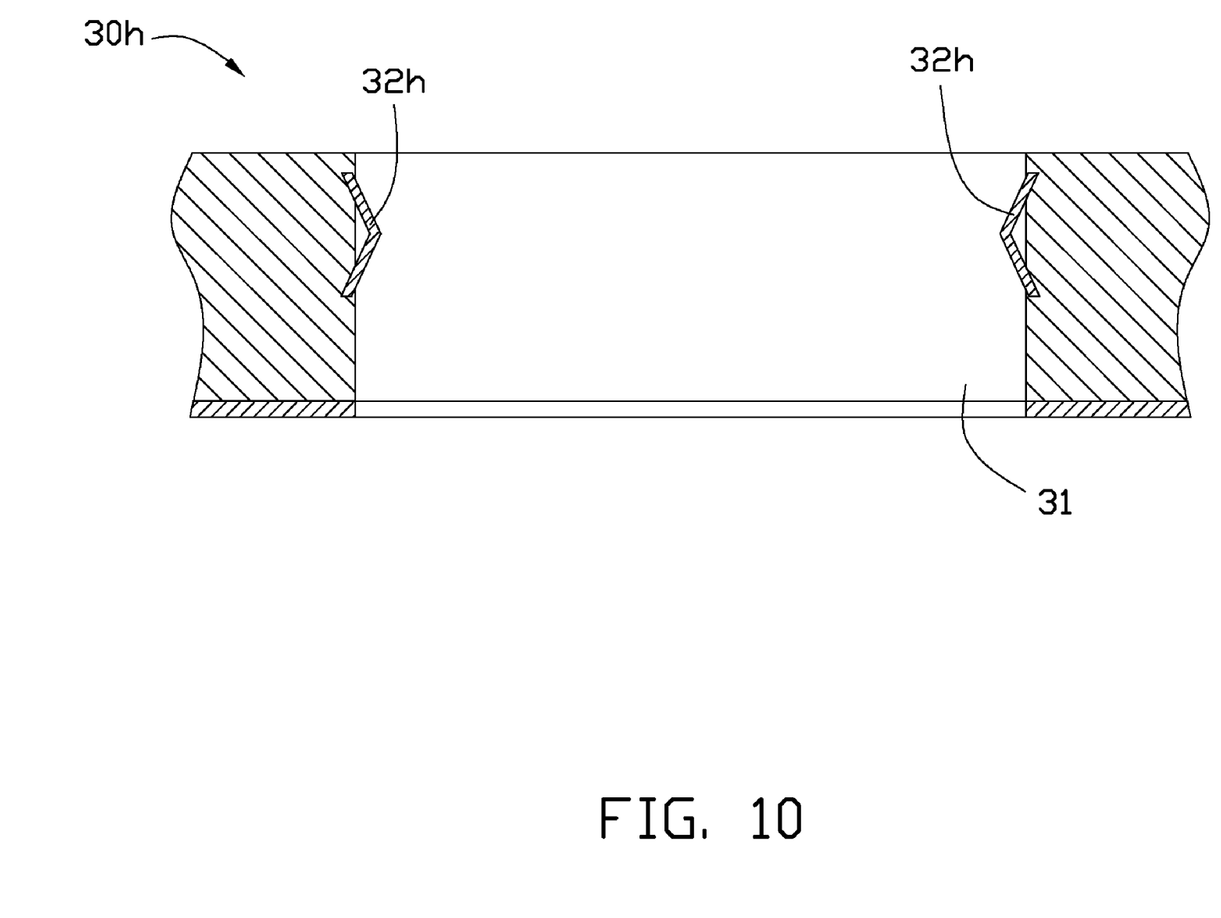
FIG. 10 is similar to FIG. 1, but shows a circuit board of a light source module of a ninth embodiment of the disclosure.

Referring to FIG. 10, a circuit board 30h of a light source module, according to a ninth embodiment of the disclosure, is shown. The circuit board 30h differs from the circuit board 30 of the first embodiment FIGS. 1 and 2 in that each elastic electrode 32h is V-shaped. Each elastic electrode 32h has two opposite ends fixed on the inner surface of the circuit board 30h surrounding the accommodating hole 31, and a middle portion extending into the accommodating hole 31.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being preferred or embodiments of the disclosure.

What is claimed is:

1. A light source module comprising:
   a light emitting diode chip;
   a casting comprising a first surface, a second surface opposite to the first surface, and an outer peripheral side surface interconnecting the first surface and the second surface, the casting defining a receiving space concaved inwardly from the first surface thereof, the receiving space receiving the light emitting diode chip therein, and a through hole extending from the receiving space to the second surface;
   two metallic electrodes separated from each other, each of the metallic electrodes comprising a first terminal electrically connecting with the light emitting diode chip, and a second terminal disposed at the outer peripheral side surface of the casting;
   a heat sink filled in the through hole and thermally contacting the light emitting diode chip, the heat sink thermally and electrically insulated from the two metallic electrodes by the casting;
   a circuit board comprising an accommodating hole defined therein, and two elastic electrodes formed on an inner surface thereof surrounding the accommodating hole, the casting being completely received in the accommodating hole, the first surface of the casting being coplanar with a top surface of the circuit board, and the elastic electrodes abutting against the second terminals of the metallic electrodes, respectively; and
   a heat dissipation device thermally connecting with the heat sink and the second surface of the casting.

2. The light source module of claim 1, wherein the second terminal of each metallic electrode contacts the outer peripheral side surface of the casting, and extends upwardly or downwardly from a corresponding first terminal along the outer peripheral side surface.

3. The light source module of claim 1, wherein the second terminal of each metallic electrode is spaced from the outer peripheral side surface, and extends obliquely and outwardly from a corresponding first terminal.

4. The light source module of claim 1, wherein each of the elastic electrodes is arcuate or V-shaped, with two opposite ends thereof fixed on the inner surface of the circuit board surrounding the accommodating hole, and a middle portion thereof extending into the accommodating hole.

5. The light source module of claim 1, wherein each of the elastic electrodes is straight, with one end thereof fixed on the inner surface of the circuit board surrounding the accommodating hole, and another opposite end obliquely extending into the accommodating hole.

6. The light source module of claim 1, wherein a height of the heat sink is less than a depth of the through hole, the heat sink is partially received in the hole, the heat sink has a surface higher than the second surface of the casting, the surface of the heat sink and the second surface of the casting cooperatively form a step surface therebetween, the heat dissipation device comprises a base extending a protrusion toward the light emitting diode chip, and the protrusion is engaged in the through hole at the step surface, and contacts the heat sink.

7. The light source module of claim 1, wherein the heat sink protrudes out from the second surface of the casting, the heat dissipation device comprises a base defining a recess therein, and a portion of the heat sink protruding out from the second surface of the casting is engaged in the recess and contacts the base.

8. The light source module of claim 1, wherein the heat dissipation device comprising a base against which the circuit board abuts.

9. The light source module of claim 1, wherein each metallic electrode extends from the light emitting diode chip to the outer peripheral side surface all the way through the casting, and further extends along the outer peripheral side surface.

10. The light source module of claim 1, wherein a base material of the casting is selected from the group consisting of liquid crystal polymer and thermoplastic resin.

* * * * *